(12) United States Patent
Chung et al.

(10) Patent No.: US 7,247,540 B2
(45) Date of Patent: Jul. 24, 2007

(54) METHODS OF FORMING FIELD EFFECT TRANSISTORS HAVING RECESSED CHANNEL REGIONS

(75) Inventors: Sung-hoon Chung, Gyeonggi-do (KR); Byeong-yun Nam, Gyeonggi-do (KR); Kyeong-koo Chi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 332 days.

(21) Appl. No.: 11/109,292

(22) Filed: Apr. 19, 2005

(65) Prior Publication Data
US 2005/0266648 A1     Dec. 1, 2005

(30) Foreign Application Priority Data
May 28, 2004   (KR) .................. 10-2004-0038206

(51) Int. Cl.
*H01L 21/336* (2006.01)
(52) U.S. Cl. .............. 438/279; 438/270; 438/585; 438/589; 257/E21.428
(58) Field of Classification Search ............... None
See application file for complete search history.

(56) References Cited
U.S. PATENT DOCUMENTS
2004/0126948 A1* 7/2004 Lee .................. 438/197
2005/0079661 A1* 4/2005 Cho et al. ............ 438/197
2005/0133836 A1* 6/2005 Seo et al. ............ 257/288

FOREIGN PATENT DOCUMENTS
JP         11074527       3/1999
JP        2001015591      1/2001

* cited by examiner

*Primary Examiner*—Michael Lebentritt
*Assistant Examiner*—Cheung Lee
(74) *Attorney, Agent, or Firm*—Myers Bigel Sibley & Sajovec PA

(57) ABSTRACT

Methods of forming field effect transistors include the steps of forming a first electrically insulating layer on a semiconductor substrate having a plurality of trench isolation regions therein that define an active region therebetween. The first electrically insulating layer is then patterned to define a first plurality of openings therein that extend opposite the active region. A trench mask having a second plurality of openings therein is then formed by filling the first plurality of openings with electrically insulating plugs and then etching the patterned first electrically insulating layer using the electrically insulating plugs as an etching mask. A plurality of trenches are then formed in the active region by etching the semiconductor substrate using the trench mask as an etching mask. A plurality of insulated gate electrodes are then formed that extend into the plurality of trenches.

17 Claims, 9 Drawing Sheets

METHODS OF FORMING FIELD EFFECT TRANSISTORS HAVING RECESSED CHANNEL REGIONS

REFERENCE TO PRIORITY APPLICATION

This application claims priority to Korean Application Serial No. 2004-38206, filed May 28, 2004, the disclosure of which is hereby incorporated herein by reference.

FIELD OF THE INVENTION

The present invention relates to methods of forming integrated circuit devices and, more particularly, to methods of forming field effect transistors.

BACKGROUND OF THE INVENTION

As the channel lengths of highly integrated MOSFETs decrease, the adverse influences of short-channel effects and source/drain punch-through typically increase. In particular, as the design rules of MOSFETs decrease, leakage currents resulting from short-channel effects typically increase and thereby cause a reduction in refresh time of some memory cells (e.g., DRAM memory cells). To limit these short-channel effects, MOSFETs having recessed channels have been developed. These MOSFETs can include the formation of a recess trench in a semiconductor substrate, which is used to support the formation of an effectively longer channel region even as the lateral dimensions of the MOSFETs within a semiconductor substrate are decreased. The use of effectively longer channel regions may also reduce any need to perform counter doping in a channel region as a means to modify threshold voltage to compensate for short-channel effects.

Conventional methods of forming MOSFETs having recessed channel regions are illustrated by FIGS. 1-4. In particular, FIG. 1 illustrates the formation of oxide-filled trench isolation regions 15, which define a semiconductor active region within a semiconductor substrate 10. A pad oxide layer 20 and a silicon oxynitride layer 25 are formed on a surface of the semiconductor substrate 10. The pad oxide layer 20 and the silicon oxynitride layer 25 collectively define a mask layer 30. A photoresist pattern 35, which may be photolithographically defined using conventional techniques, is formed on the mask layer 30. The spacings "d" between adjacent portions of the photoresist pattern 35 define a width of recess trenches to be formed in the substrate 10 during subsequent process steps. As will be understood by those skilled in the art, photoresist bridging problems may occur as the spacings "d" are reduced in order to achieve higher levels of integration. As illustrated by FIG. 2, the mask layer 30 is then etched using the photoresist pattern 35 as an etching mask. This etching step results in the formation of a pad oxide layer pattern 20a and a silicon oxynitride layer pattern 25a, which collectively define a mask pattern 30a. During this etching step, the surface of the substrate 10 may be exposed. Moreover, because of a reduced selectivity between etching the silicon oxynitride layer 25 and the pad oxide layer 20 relative to the trench isolation regions 15, overetching of the trench isolation regions 15 may occur. This overetching may result in the formation of recesses 40 within the trench isolation regions 15. In some cases, these recesses 40 may expose portions of the substrate 10 which extend along sidewalls of the trench isolation regions 15.

As illustrated by FIG. 3, the photoresist pattern 35 is then removed and followed by the step of selectively etching recess trenches 45 into the substrate 10, using the mask pattern 30a as an etching mask. During this etching step, the recesses 40 within the trench isolation regions 15 may be deepened. FIG. 4 illustrates the removal of the mask pattern 30a using a cleaning step. This cleaning step, which may include exposing the surface of the substrate 10 to chemical etchants (e.g., oxide and polymer residue etchants), may result in a further deepening of the recesses 40 within the trench isolation regions 15. Unfortunately, the formation of relatively deep recesses 40 within the trench isolation regions 15 may result in the exposure of the substrate 10 along sidewalls of the trench isolation regions 15. This exposure of the substrate 10 may support the formation of parasitic transistors and excessive junction leakage within the active region of the substrate 10 and thereby adversely influence the refresh characteristics of memory devices formed in the substrate 10. Thus, notwithstanding conventional methods of forming transistors having recessed channel regions, there continues to be a need for improved methods which are less susceptible to the formation of recesses within trench isolation regions.

SUMMARY OF THE INVENTION

Methods of forming field effect transistors according to embodiments of the present invention include the steps of forming a first electrically insulating layer on a semiconductor substrate having a plurality of trench isolation regions therein that define an active region therebetween. The first electrically insulating layer is patterned to define a first plurality of openings therein that extend opposite the active region. A trench mask having a second plurality of openings therein is then formed as a reverse-image mask relative to the patterned first plurality of openings. This trench mask is formed by filling the first plurality of openings with electrically insulating plugs and then etching back the patterned first electrically insulating layer using the electrically insulating plugs as an etching mask. A plurality of trenches are then formed in the active region by etching the semiconductor substrate using the trench mask as an etching mask. A plurality of insulated gate electrodes are then formed that extend into the plurality of trenches. Source/drain regions and contacts may then be formed on the substrate to complete the transistor structure.

Additional methods of forming an insulated-gate field effect transistor include forming a first electrically insulating layer on a surface of a semiconductor active region. This first electrically insulating layer may be a composite of a silicon dioxide layer and a silicon oxynitride layer. The first electrically insulating layer is then patterned to define a plurality of openings therein that extend opposite the semiconductor active region. A trench mask having a second plurality of openings is then formed on the active region. The trench mask is formed by filling the first plurality of openings with electrically insulating plugs and then etching the patterned first electrically insulating layer using the electrically insulating plugs as an etching mask. A plurality of trenches are then formed in the active region by etching the semiconductor active region using the trench mask as an etching mask. The trenches are then filled with insulated gate electrodes. Source/drain regions and contacts may also be formed on the substrate to complete the transistor.

BRIEF DESCRIPTION OF THE DRAWINGS

FIGS. 6A-11A are cross-sectional views of intermediate structures that illustrate methods forming an array of MOSFETs according to embodiments of the present invention, taken along line A-A' in FIG. 5.

FIGS. 6B-11B are cross-sectional views of intermediate structures that illustrate methods forming an array of MOSFETs according to embodiments of the present invention, taken along line B-B' in FIG. 5.

DETAILED DESCRIPTION OF PREFERRED EMBODIMENTS

Figure 1:
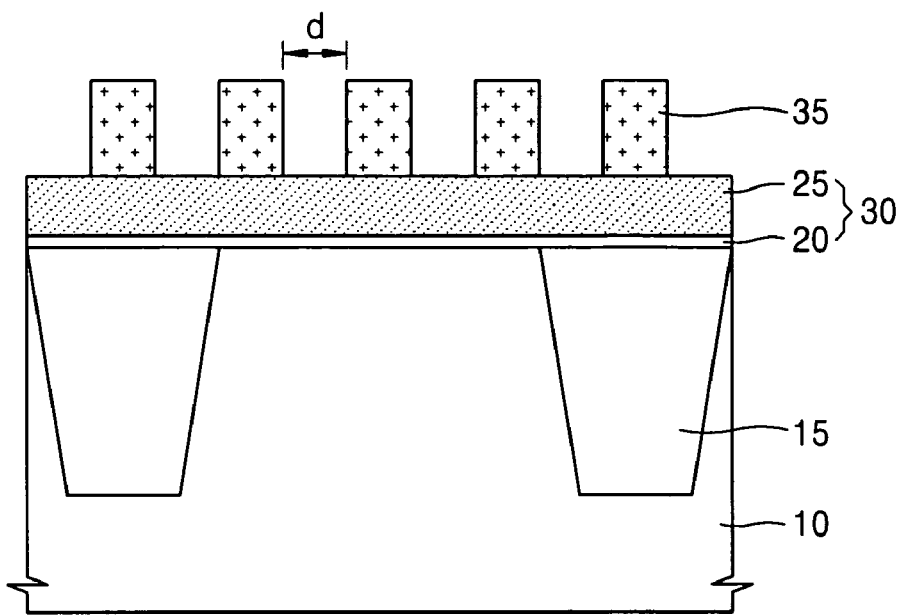
FIGS. 1-4 are cross-sectional views of intermediate structures that illustrate conventional methods of forming trenches in semiconductor substrates.
Figure 2:
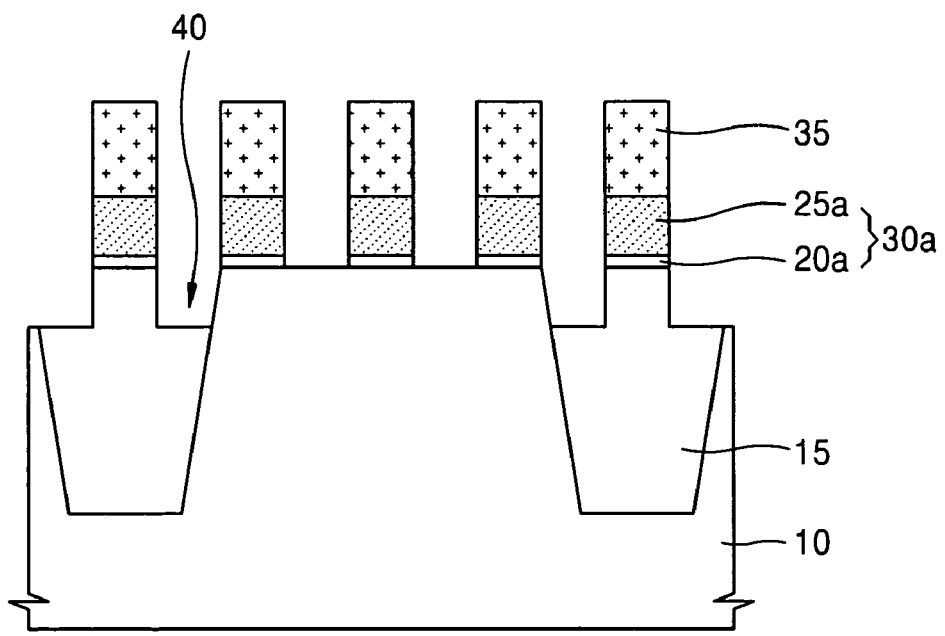
Figure 3:
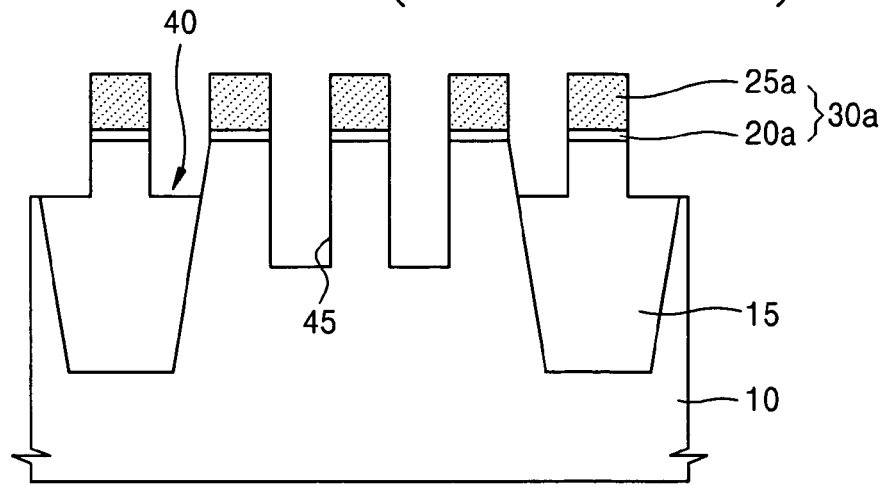
Figure 4:
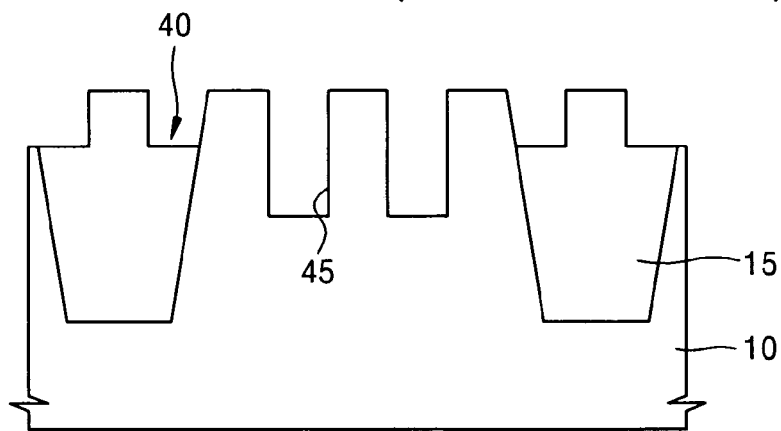

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Figure 5:
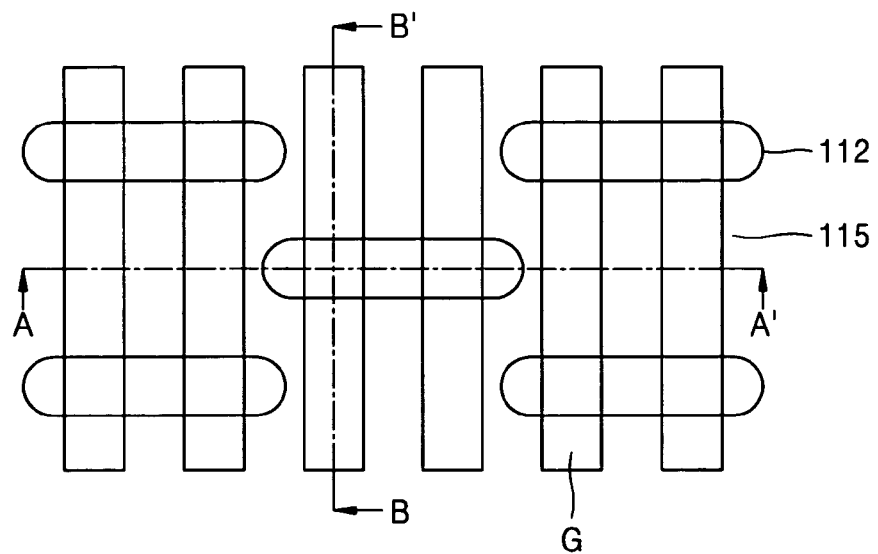
FIG. 5 is a layout view of an array of MOSFETs having recessed channel regions, which is formed according to embodiments of the present invention.

FIG. 5 illustrates a layout view of an array of MOSFETs having recessed channel regions. In this layout view, the active regions 112 are illustrated as being surrounded by device isolation regions 115 (e.g., trench isolation regions). The regions identified with the letter "G" represent the shape of trench-based gate electrodes (see, e.g., FIG. 12). Each active region 112 is illustrated as being covered by a pair of gate electrodes G. As will now be described, FIGS. 6A-11A represent cross-sectional views of intermediate structures that illustrate methods forming an array of MOSFETs according to embodiments of the present invention. These cross-section views are taken along line A-A' in FIG. 5. In addition, FIGS. 6B-11B represent cross-sectional views of intermediate structures taken along line B-B' in FIG. 5.

Figure 6A:
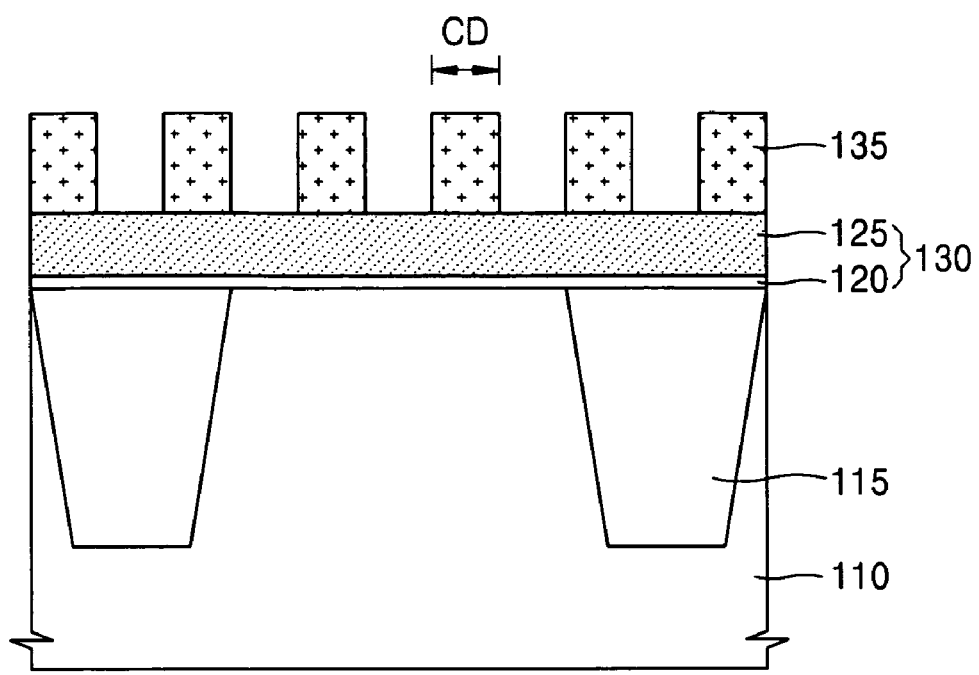
Figure 6B:
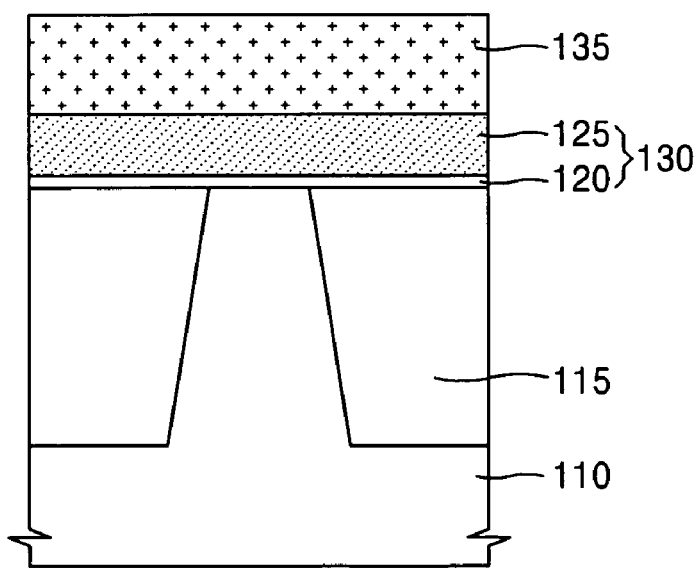

FIGS. 6A-6B illustrate the formation of oxide-filled trench isolation regions 115 within a semiconductor substrate 110. These trench isolation regions 115 define a semiconductor active region, which extends between adjacent trench isolation regions 115. A pad oxide layer 120 and a silicon oxynitride layer 125 are formed on a primary surface of the substrate 110. The pad oxide layer 120 and the silicon oxynitride layer 125 collectively define a mask layer 130. These steps of forming a mask layer 130 may be preceded by steps to implant channel control dopants (not shown) and shallow source/drain dopants (not shown) into the active region within the substrate 110.

The pad oxide layer 120 may be a silicon dioxide ($SiO_2$) layer formed by a deposition method or a thermal oxidation method. Typical deposition methods include chemical vapor deposition (CVD), sub-atmospheric chemical vapor deposition (SACVD), low pressure chemical vapor deposition (LPCVD) and plasma-enhanced chemical vapor deposition (PECVD). In particular, the pad oxide layer 120 may be formed as a middle temperature oxide (MTO) layer using $SiH_4$, $Si_2H_6$ and $N_2O$ gases as reaction gases. The pad oxide layer 120 may be formed to have a thickness of about 100 Å. The silicon oxynitride layer 125 may be formed to have a thickness in a range from about 800 Å to about 850 Å, however, thinner or thicker layers of silicon oxynitride may also be formed. In alternative embodiments of the present invention, a silicon nitride layer may be formed in place of the silicon oxynitride layer 125. Such a silicon nitride layer may be deposited at a temperature in a range from about 500° C. to about 850° C. by reacting $SiH_4$ with $NH_3$. The silicon oxynitride layer 125 may be formed by reacting an oxygen source gas with $SiH_4$ and $NH_3$.

A photoresist pattern 135, which may be a photolithographically defined pattern, is then formed on the mask layer 130. The widths "CD" of the photoresist pattern 135 define a width of recess trenches to be formed in the substrate 110 during subsequent process steps. The widths "CD" of the photoresist pattern 135 of FIG. 6A may be smaller than the spacing "d" between adjacent portions of a photoresist pattern 35 of FIG. 1. The widths "CD" of the photoresist pattern 135 may be made small by using a bar-type photolithography profile with narrow width "CD". However, alternative techniques for forming the photoresist pattern 135 may include using photoresist trimming techniques to obtain a narrow width "CD". Such trimming techniques may support the formation of very narrow trenches within the substrate 110, with reduced susceptibility to photoresist bridging.

Figure 7A:
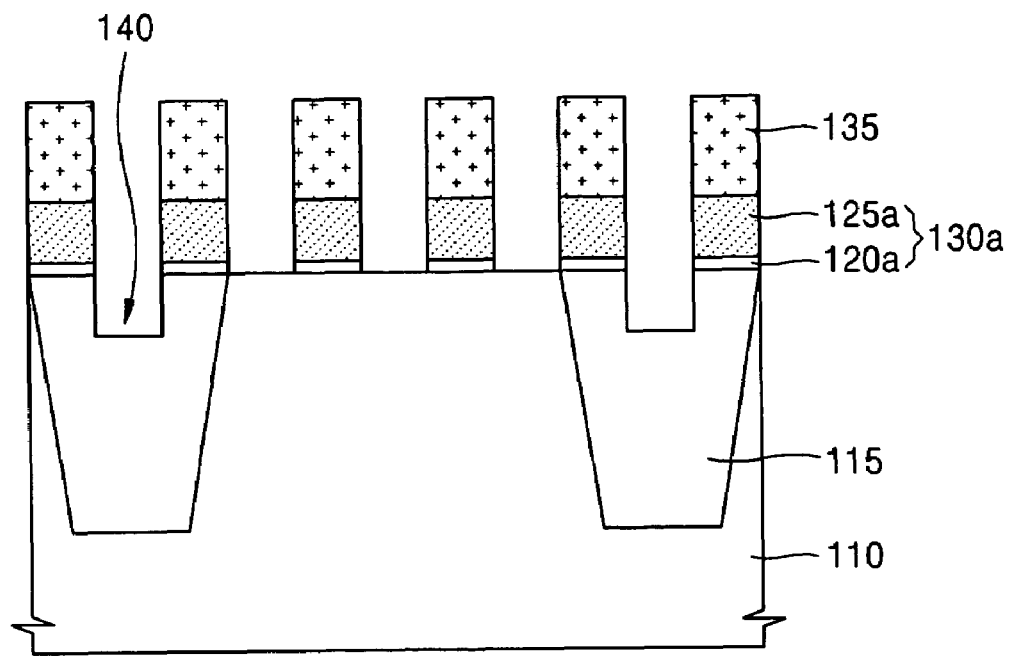
Figure 7B:
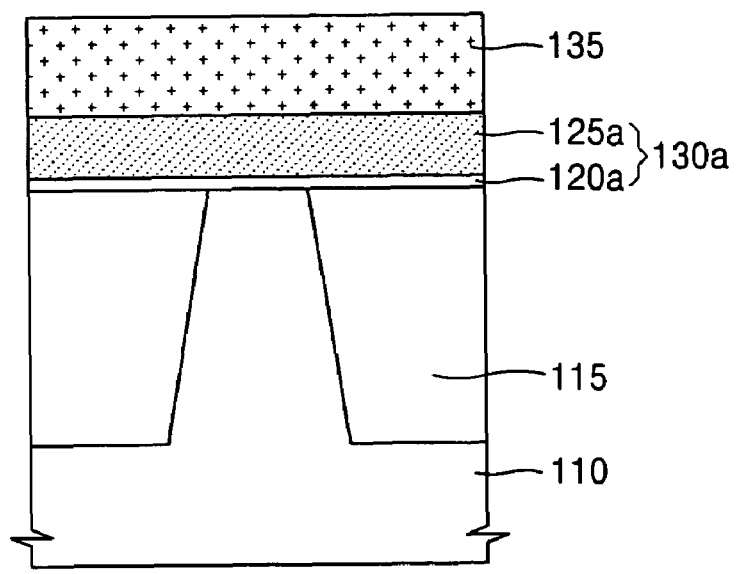

Referring now to FIGS. 7A-7B, the mask layer 130 is then etched using the photoresist pattern 135 as an etching mask. This etching step results in the formation of a pad oxide layer pattern 120a and a silicon oxynitride layer pattern 125a, which collectively define a mask pattern 130a. During this etching step, the surface of the substrate 110 may be exposed. The etching of the silicon oxynitride layer 125 may include exposing the silicon oxynitride layer 125 to a fluoride and carbon containing gas such as $CF_4$, $CHF_3$, $C_2F_6$, $C_4F_8$, $CH_2F_2$, $CH_3F$, $CH_4$, $C_2H_2$ or $C_4F_6$ and mixtures thereof, along with an argon ambient gas. Because of a reduced selectivity between etching the silicon oxynitride layer 125 and the pad oxide layer 120 relative to the trench isolation regions 115, overetching of the trench isolation regions 115 may occur. This overetching may result in the formation of recesses 140 within the trench isolation regions 115. In some cases resulting from photolithographic misalignment, these recesses 140 may expose portions of the substrate 110 which extend along sidewalls of the trench isolation regions 115.

Figure 8A:
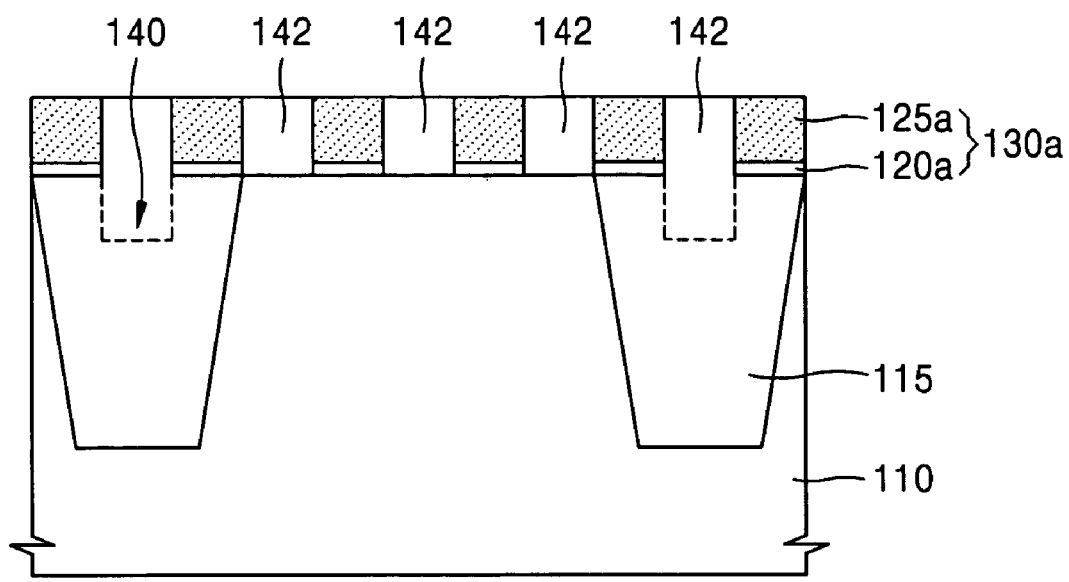
Figure 8B:
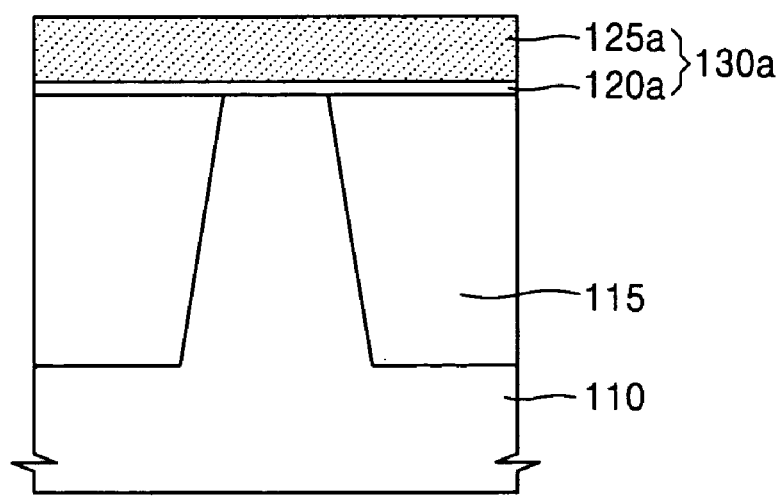

As illustrated by FIGS. 8A-8B, the photoresist pattern 135 is removed by performing a cleaning step and then a blanket electrically insulating layer (e.g., silicon dioxide layer) is conformally deposited on the silicon oxynitride layer pattern 125a. This blanket electrically insulating layer may be formed by depositing a borophosphosilicate glass (BPSG) layer, a spin-on glass layer (SOG) layer, an undoped silicate glass layer (USG) layer, a flowable oxide layer, a Si—O—H group (FOX) layer or a silicon dioxide layer on the silicon oxynitride layer pattern 125a. A silicon dioxide layer may be formed using a high density plasma chemical vapor deposition (HDP-CVD) technique. A plasma may also be used to form a tetraethylorthosilicate (TEOS) glass layer as the blanket electrically insulating layer. The blanket electrically insulating layer is then planarized using the silicon oxynitride layer pattern 125a to detect an end point of the planarization step. This planarization step, which may include chemically mechanically polishing (CMP) the blanket layer, results in the formation of a plurality of electrically insulating plugs 142. As illustrated, these electrically insulating plugs 142 advantageously fill the recesses 140 within the trench isolation regions 115 and the openings in the mask pattern 130a.

Figure 9A:
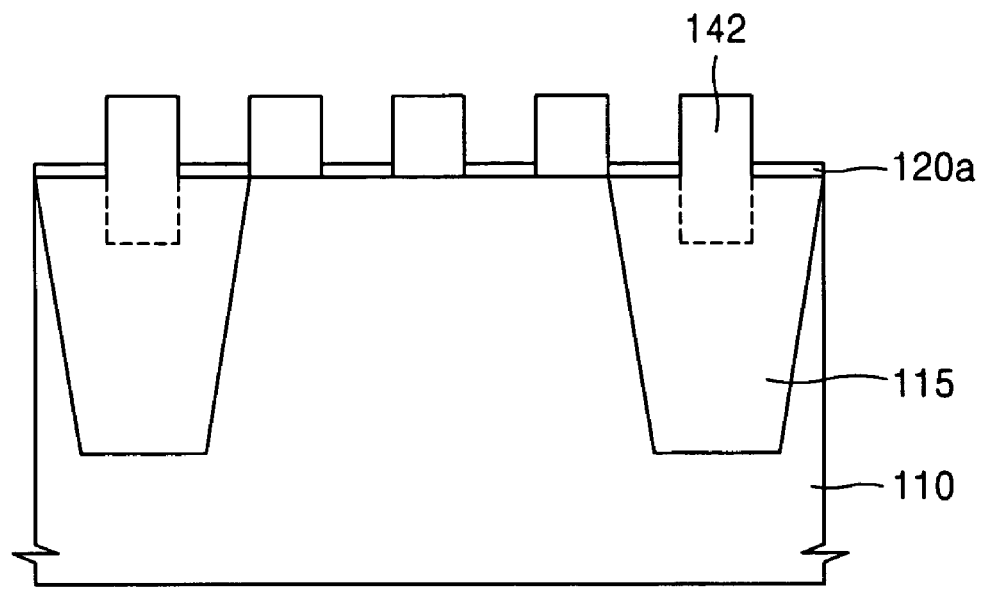
Figure 9B:
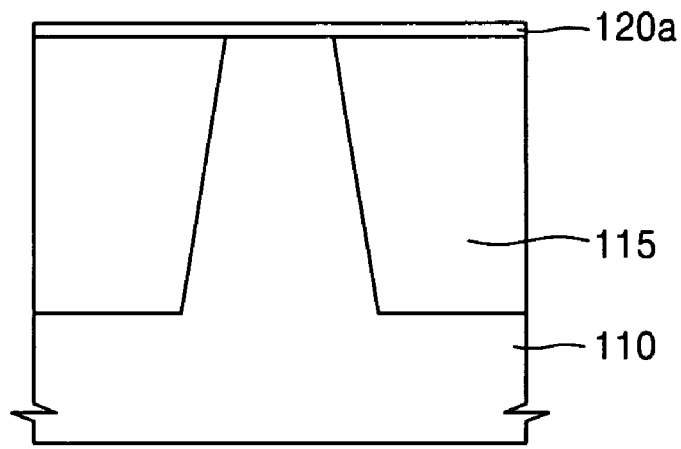
Figure 10A:
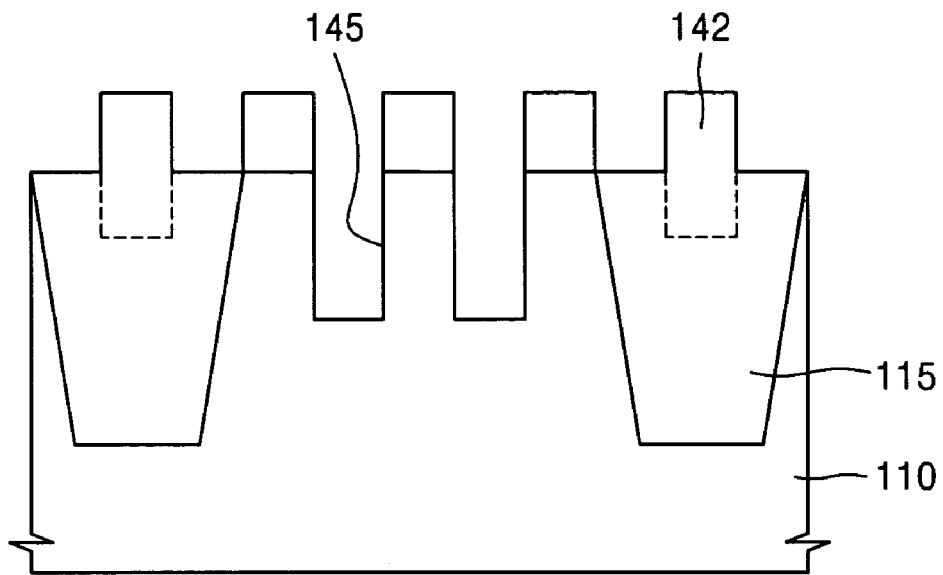
Figure 10B:
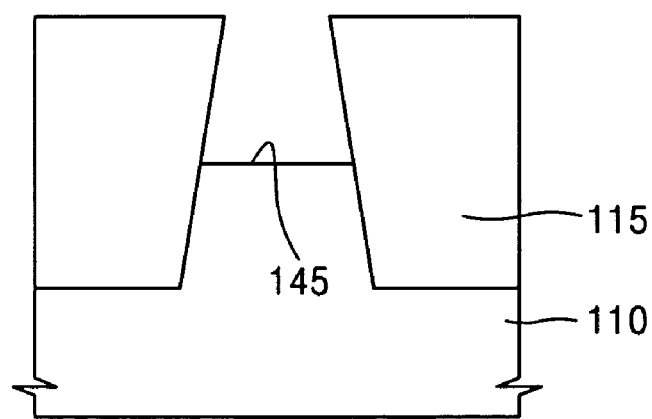

As illustrated by FIGS. 9A-9B, after the formation of the electrically insulating plugs 142, the silicon oxynitride layer pattern 125a is removed from the substrate 110. This silicon oxynitride layer pattern 125a may be removed by performing an etching step. This etching step may be a wet etching step (e.g., phosphoric stripping). The removal of the silicon oxynitride layer pattern 125a exposes the pad oxide layer pattern 120a. A sequence of etching steps are then performed to remove the pad oxide layer pattern 120a and selectively etch the substrate 110 to thereby form a plurality of trenches 145 that extend into the active region within the substrate 110. These trenches 145 may be formed to a depth from about 1000 Å to about 1500 Å. This step of etching the substrate 110 may be performed as a reactive ion etching (REI) step using a mixed gas of $Cl_2$ and $SF_6$. During these etching steps, the electrically insulating plugs 142 are used an etching mask. These electrically insulating plugs 142 represent a "reverse" of the mask defined by the silicon oxynitride layer pattern 125a, which means the widths of "negative" openings between the plugs 142 represent a width of the "positive" features in the silicon oxynitride layer pattern 125a. Once the trenches 145 have been formed, an ion implantation step may be performed to implant dopants (not shown) into the bottoms of the trenches 145, using the electrically insulating plugs 142 as an implantation mask.

Figure 11A:
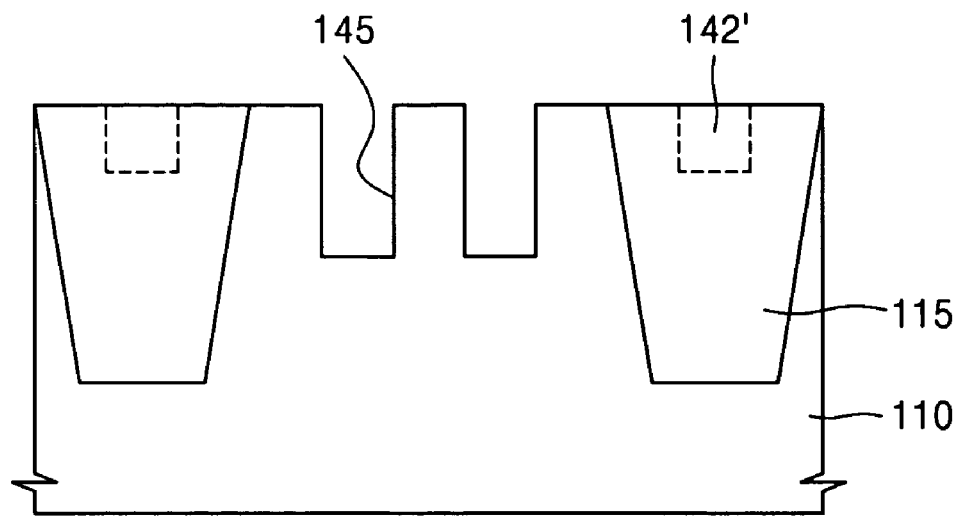
Figure 11B:
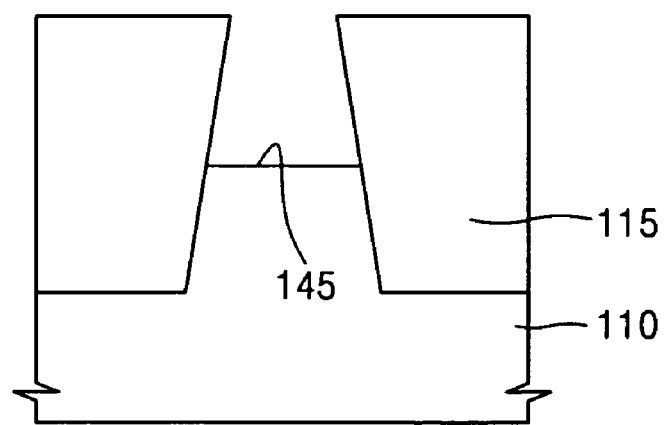

Referring now to FIGS. 11A-11B, the electrically insulating plugs 142 are removed from a surface of the active region within the substrate 110. This removal step may be performed by exposing the substrate 110 to a diluted HF solution or a buffered oxide etchant, for example. This removal step also removes upper portions of the electrically insulating plugs 142 from the trench isolation regions 115. The remaining lower portions of the electrically insulating plugs 142 represent electrically insulating plug residues 142'. In order to prevent the removal step from forming significant recesses within the trench isolation regions 115, the height of the electrically insulating plugs 142 (see, e.g., FIGS. 8A-8B, 9A-9B, 10A-10B) can be reduced. The actual heights of the electrically insulating plugs 142 may be determined in view of the degree of selectivity of the etching steps performed during formation of the trenches 145 within the active region. If the oxide layer selectivity is greater than about 10:1, which is a typical condition, then the height of the electrically insulating plugs 142 may be set to about 300 Å. This desired height should be set by controlling a thickness of the mask pattern 130a.

Figure 12:
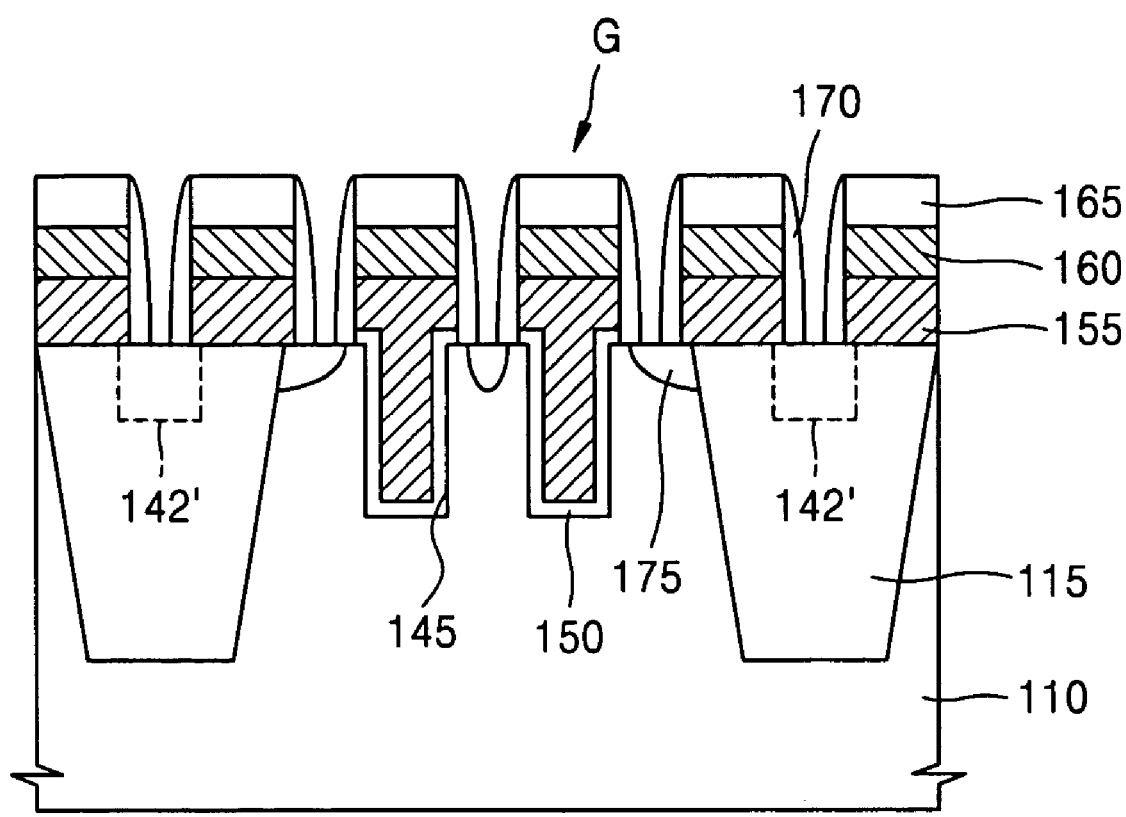
FIG. 12 is a cross-sectional view an array of MOSFETs having recessed channel regions, which may be formed by the methods illustrated by FIGS. 6A-11A and 6B-11B.

Referring still to FIGS. 11A-11B, the semiconductor substrate 110 may be further etched using a chemical dry etching (CDE) technique, which operates to remove unetched silicon from upper corners of the trenches 145 and round lower corners of the trenches 145. As illustrated by FIG. 12, additional process steps can be performed to define a plurality of insulated gate electrodes G having recessed channel regions, which support inversion-layer channels that wrap-around bottoms of the trenches 145 during on-state forward conduction. These gate electrodes G may be formed by conformally depositing a gate insulating layer 150 on the substrate 110 illustrated by FIGS. 11A-11B and then patterning the gate insulating layer 150 so that it extends adjacent bottoms and sidewalls of the trenches 145. This gate insulating layer 150 may be a silicon dioxide layer, a titanium oxide layer or a tantalum oxide layer, for example.

The trenches 145 are then filled with a polysilicon gate layer 155, which also extends onto the surface of the substrate 110. This gate layer 155 may be deposited using a low pressure chemical vapor deposition (LPCVD) technique at a temperature in a range from about 500° C. to about 700° C. The conductivity of the deposited gate layer 155 may be increased by implanting dopants (e.g., N-type dopants) into the gate layer 155 or by using in-situ doping techniques when the gate layer 155 is being formed.

A gate metal layer 160 (e.g., a WSi layer) and an electrically insulating gate capping layer 165 are then formed on the polysilicon gate layer 155 and patterned to define a plurality of gate electrodes G that extend opposite the active region and a plurality of gate structures that extend on the trench isolation regions 115. Sidewall insulating spacers 170 are formed on the sidewalls of the gate electrodes G and gate structures. The gate capping layer 165 and the sidewall insulating spacers 170 may then be used as an ion-implantation mask during the formation of source/drain regions 175. These source/drain regions 175 may be formed by implanting source/drain region dopants into exposed portions of the active region and then annealing the substrate 110 to drive-in the dopants.

Accordingly, methods of forming field effect transistors according to embodiments of the present invention include the steps of forming a first electrically insulating layer 130 on a semiconductor substrate 110 having a plurality of trench isolation regions 115 therein that define an active region therebetween. The first electrically insulating layer 130 is then patterned to define a first plurality of openings therein that extend opposite the active region. A trench mask having a second plurality of openings therein is then formed by filling the first plurality of openings with electrically insulating plugs 142 and then etching back the patterned first electrically insulating layer 130a using the electrically insulating plugs 142 as an etching mask. A plurality of trenches 145 are then formed in the active region by etching the semiconductor substrate 110 using the trench mask as an etching mask. A plurality of insulated gate electrodes G are then formed that extend into the plurality of trenches 145.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an insulated-gate field effect transistor, comprising:

forming a first electrically insulating layer on a semiconductor substrate having a plurality of trench isolation regions therein that define an active region therebetween;

patterning the first electrically insulating layer to define a first plurality of openings therein that extend opposite the active region;

forming a trench mask having a second plurality of openings therein by filling the first plurality of openings with electrically insulating plugs and then etching the patterned first electrically insulating layer using the electrically insulating plugs as an etching mask;

forming a plurality of trenches in the active region by etching the semiconductor substrate using the trench mask as an etching mask; and forming a plurality of insulated gate electrodes that extend into the plurality of trenches.

2. The method of claim 1, wherein said step of forming a plurality of insulated gate electrodes is followed by the step of implanting source/drain region dopants into the active region using the insulated gate electrodes as an implantation mask.

3. The method of claim 1, wherein the first plurality of openings are larger than the second plurality of openings.

4. The method of claim 1, wherein said step of patterning the first electrically insulating layer comprises etching the plurality of trench isolation regions to define a plurality of recesses therein; and wherein said step of forming a trench mask comprises filling the plurality of recesses in the trench isolation regions with electrically insulating plugs.

5. The method of claim 1, wherein said step of forming a plurality of insulated gate electrodes comprises forming polysilicon gate electrodes that extend into the plurality of trenches and forming electrically insulating sidewall spacers on sidewalls of the polysilicon gate electrodes.

6. The method of claim 1, wherein said step of forming a first electrically insulating layer comprises forming a silicon dioxide layer on a surface of the semiconductor substrate and then forming a silicon oxynitride layer on the silicon dioxide layer.

7. The method of claim 6, wherein said step of patterning the first electrically insulating layer comprises etching the silicon oxynitride layer and the silicon dioxide layer in sequence to expose the surface of the semiconductor substrate.

8. The method of claim 7, wherein said step of forming a trench mask comprises etching the silicon oxynitride layer to expose the silicon dioxide layer; and wherein said step of forming a plurality of trenches comprises etching the silicon dioxide layer and the semiconductor substrate in sequence.

9. A method of forming an insulated-gate field effect transistor having a recessed channel region, comprising:
    forming a first electrically insulating layer on a surface of a semiconductor active region;
    patterning the first electrically insulating layer to define a plurality of openings therein that extend opposite the semiconductor active region;
    forming a trench mask having a second plurality of openings therein by filling the first plurality of openings with electrically insulating plugs and then etching the patterned first electrically insulating layer using the electrically insulating plugs as an etching mask;
    forming a plurality of trenches in the active region by etching the semiconductor active region using the trench mask as an etching mask; and
    forming a plurality of insulated gate electrodes that extend into the plurality of trenches.

10. The method of claim 9, wherein said step of forming a plurality of insulated gate electrodes is followed by the step of implanting source/drain region dopants into the semiconductor active region using the insulated gate electrodes as an implantation mask.

11. The method of claim 9, wherein the first plurality of openings are larger than the second plurality of openings.

12. The method of claim 9, wherein said step of forming a plurality of insulated gate electrodes comprises forming polysilicon gate electrodes that extend into the plurality of trenches and forming electrically insulating sidewall spacers on sidewalls of the polysilicon gate electrodes.

13. The method of claim 9, wherein said step of forming a first electrically insulating layer comprises forming a silicon dioxide layer on a surface of the semiconductor substrate and then forming a silicon oxynitride layer on the silicon dioxide layer.

14. The method of claim 13, wherein said step of patterning the first electrically insulating layer comprises etching the silicon oxynitride layer and the silicon dioxide layer in sequence to expose the surface of the semiconductor substrate.

15. The method of claim 14, wherein said step of forming a trench mask comprises etching the silicon oxynitride layer to expose the silicon dioxide layer; and wherein said step of forming a plurality of trenches comprises etching the silicon dioxide layer and the semiconductor substrate in sequence.

16. A method of forming an insulated-gate field effect transistor having a trench-based gate electrode, comprising:
    forming a first electrically insulating layer on a surface of a semiconductor active region;
    patterning the first electrically insulating layer to define a plurality of openings therein that extend opposite the semiconductor active region;
    depositing a second electrically insulating layer that extends on the patterned first electrically insulating layer and into the plurality of openings;
    planarizing the second electrically insulating layer to define a plurality of electrically insulating plugs in the plurality of openings;
    forming a plurality of trenches in the semiconductor active region by etching the patterned first electrically insulating layer and the semiconductor active region in sequence using the plurality of electrically insulating plugs as an etching mask; and
    forming a plurality of insulated gate electrodes that extend into the plurality of trenches.

17. The method of claim 16, wherein said step of forming a plurality of insulated gate electrodes is followed by the step of forming source and drain regions in the semiconductor active region by implanting source/drain dopants into the semiconductor active region using the plurality of insulated gate electrodes as an implant mask.

* * * * *